United States Patent
Teng et al.

(10) Patent No.: US 7,706,999 B2
(45) Date of Patent: Apr. 27, 2010

(54) CIRCUIT TESTING APPARATUS

(75) Inventors: Cheng-Yung Teng, Taipei County (TW); Li-Jieu Hsu, Taipei (TW); Jie-Wei Huang, Taipei County (TW); Huei-Huang Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 314 days.

(21) Appl. No.: 11/806,499

(22) Filed: May 31, 2007

(65) Prior Publication Data

US 2008/0243409 A1 Oct. 2, 2008

(30) Foreign Application Priority Data

Mar. 29, 2007 (TW) .............................. 96205077 U

(51) Int. Cl.
*G01R 31/26* (2006.01)
*G06F 17/40* (2006.01)
*G06F 19/00* (2006.01)

(52) U.S. Cl. ........................ 702/117; 324/500; 324/537; 324/555; 324/754; 324/759; 702/1; 702/108; 702/124; 702/127; 702/187; 702/189

(58) Field of Classification Search .............. 324/76.11, 324/500, 512, 537, 555, 600, 602, 605, 607, 324/754, 755, 759, 763, 765; 341/126, 141, 341/155; 702/1, 57, 66, 108, 116, 117, 118, 702/121, 124, 126, 127, 187, 189
See application file for complete search history.

(56) References Cited

U.S. PATENT DOCUMENTS

| | | | | | |
|---|---|---|---|---|---|
| 2,950,437 | A | * | 8/1960 | Stahl ......................... | 324/73.1 |
| 3,082,374 | A | * | 3/1963 | Buuck ....................... | 324/73.1 |
| 3,219,927 | A | * | 11/1965 | Topp, Jr. et al. ............. | 714/735 |
| 3,764,995 | A | * | 10/1973 | Helf et al. .................... | 714/32 |
| 3,976,940 | A | * | 8/1976 | Chau et al. ................... | 714/736 |
| 4,057,847 | A | * | 11/1977 | Lowell et al. ................ | 702/122 |
| 4,092,589 | A | * | 5/1978 | Chau et al. ................... | 714/736 |
| RE31,056 | E | * | 10/1982 | Chau et al. ................... | 714/700 |
| 6,057,679 | A | * | 5/2000 | Slizynski et al. .......... | 324/158.1 |
| 6,154,715 | A | * | 11/2000 | Dinteman et al. ........... | 702/120 |
| 7,047,442 | B2 | * | 5/2006 | Sutton ......................... | 714/25 |
| 7,203,875 | B2 | * | 4/2007 | Syed ........................... | 714/724 |
| 7,266,739 | B2 | * | 9/2007 | Syed ........................... | 714/724 |
| 7,337,381 | B2 | * | 2/2008 | Fujisaki ....................... | 714/738 |
| 2002/0133774 | A1 | * | 9/2002 | Inoue .......................... | 714/736 |
| 2003/0200483 | A1 | * | 10/2003 | Sutton ......................... | 714/25 |
| 2005/0022080 | A1 | * | 1/2005 | Syed ........................... | 714/724 |
| 2005/0022081 | A1 | * | 1/2005 | Syed ........................... | 714/724 |
| 2006/0026482 | A1 | * | 2/2006 | Fujisaki ....................... | 714/742 |
| 2009/0105970 | A1 | * | 4/2009 | Kodera et al. ................. | 702/58 |

* cited by examiner

*Primary Examiner*—Edward R Cosimano
(74) *Attorney, Agent, or Firm*—Muncy, Geissler, Olds & Lowe, PLLC

(57) ABSTRACT

The invention discloses a circuit testing apparatus for testing a device under test. The circuit testing apparatus includes a precision measurement unit, a signal transformation module, and a microprocessor. The precision measurement unit is coupled to the device under test for providing a testing signal and receiving a measurement signal generated according to the testing signal. The signal transformation module is coupled to the precision measurement unit for receiving the measurement signal and transforming the measurement signal to a signal measurement result according to a predetermined manner. The microprocessor is coupled to the precision measurement unit and the signal transformation module for examining the signal measurement result to determine a test result for the device under test.

10 Claims, 4 Drawing Sheets

CIRCUIT TESTING APPARATUS

BACKGROUND OF THE INVENTION

1. Field of the Invention

The invention relates to a testing apparatus capable of enhancing test convenience and improving test speed.

2. Description of the Related Art

Integrated circuits (IC) are getting powerful and important, comprising analog signal processing ICs, digital signal processing ICs, and hybrid (analog and digital) signal processing ICs. Each of the integrated circuits (ICs) test after fabrication is necessary to assure the quality of the integrated circuit. The manufacturers thus determine whether the integrated circuit is qualified according to the test result and provide for the merchants.

With respect to the current IC mass production testing, ICs are tested using a logic tester. When decibel (dB) of an IC is tested, however, since the logic tester cannot directly test the decibel, an output voltage of the IC must first be tested using the logic tester and the decibel corresponding to the output voltage must be manually calculated to determine whether the IC decibel test is passed or failed. Manually calculating the decibel, however, is time-consuming for the IC test and inconvenient and reduces testing speed.

BRIEF SUMMARY OF THE INVENTION

Accordingly, an object of the invention provides a circuit testing apparatus for improving testing efficiency and solving the problems of the prior art. The invention provides circuit testing apparatuses for testing a device under test (DUT). An exemplary embodiment of a circuit testing apparatus comprises a precision measurement unit, a signal transformation module, and a microprocessor. The precision measurement unit is coupled to the device under test for providing a testing signal and receiving a measurement signal generated according to the testing signal. The signal transformation module is coupled to the precision measurement unit for receiving the measurement signal and transforming the measurement signal to a signal measurement result according a predetermined manner. The microprocessor is coupled to the precision measurement unit and the signal transformation module for examining the signal measurement result to determine a test result for the device under test.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
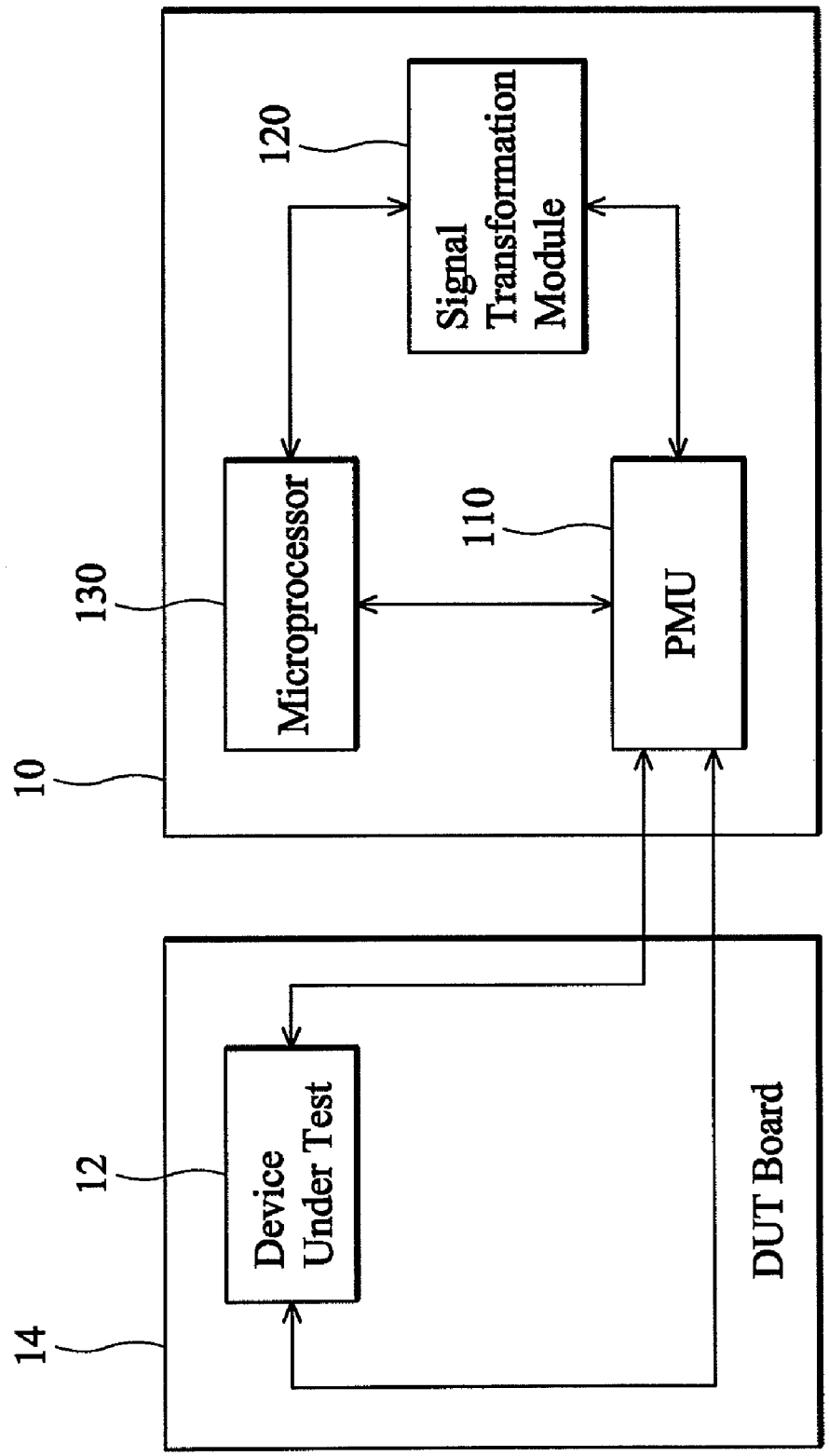
FIGS. 1A-1C are schematic views of an embodiment of a circuit testing apparatus.

Several exemplary embodiments of the invention are described with reference to FIGS. 1 through 2, which generally relate to circuit testing. It is to be understood that the following disclosure provides various different embodiments as examples for implementing different features of the invention. Specific examples of components and arrangements are described in the following to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

The invention discloses a circuit testing apparatus for testing a device under test.

FIG. 1A is a schematic view of an embodiment of a circuit testing apparatus.

Referring to FIG. 1A, circuit testing apparatus 10 exams a device under test 12. An embodiment of circuit testing apparatus 10 is a logic tester. Device under test 12 is an integrated circuit (IC) on a DUT board 14. Circuit testing apparatus 10 comprises a precision measurement unit (PMU) 110, a signal transformation module 120, and a microprocessor 130. The precision measurement unit 110 is coupled to the device under test 12 for providing a testing signal $S_T$ and receiving a measurement signal $S_M$ generated according to the testing signal $S_T$. The signal transformation module 120 is coupled to the precision measurement unit 110 for receiving the measurement signal $S_M$ and transforming the measurement signal $S_M$ to a signal measurement result $S_R$ according a predetermined manner. The microprocessor 130 is coupled to the precision measurement unit 110 and the signal transformation module 120 for examining the signal measurement result to determine a test result for the device under test 12. In an embodiment, the predetermined manner transforms the measurement signal $S_M$ providing a voltage level to the signal measurement result $S_R$ providing a decibel (dB) value.

The testing signal $S_T$ is an input voltage, the measurement signal $S_M$ is an output voltage generated based on the input voltage of the device under test 12, and the signal measurement result $S_R$ is a decibel (dB) value applied to transform the output voltage according to the predetermined manner. The following describes transforming the measurement signal $S_M$ to the signal measurement result $S_R$ according to the predetermined manner by the signal transformation module 120. In an embodiment, the predetermined manner transforms the measurement signal $S_M$ to the signal measurement result $S_R$ using a formula, represented as:

$$dB = 20 \log \frac{Vo}{Vi},$$

where dB represents a decibel (dB) value, Vi represents a voltage level (the input voltage) of the testing signal $S_T$, and Vo represents a voltage level (the output voltage) of the measurement signal $S_M$. Vi is given because the Vi value (the input voltage) is a voltage level of the testing signal $S_T$ input in the device under test 12 by the precision measurement unit 110, while the Vo value (the output voltage) is a voltage level of the measurement signal $S_M$. Thus, when the transformation using the formula is complete, the decibel (dB) value of the device under test 12 is obtained, and test pass or fail for the device under test 12 is further determined according to the obtained decibel (dB) value.

Based on the transformation using the formula, when a user-defined test pass condition of the device under test 12 provides a range restriction based on a decibel (dB) value, the decibel (dB) value is given because it is user-defined. Thus, a Vo value range corresponding to the decibel (dB) value range restriction can be calculated using the formula involving the given Vi value. Further, the precision measurement unit 110 measures and determines whether an actual Vo value is in the Vo value range corresponding to the decibel (dB) value range restriction, verifying whether test pass or fail of the device under test is returned.

Further, the decibel (dB) value range passing through the decibel (dB) testing of the device under test 12 is predefined as 20~40 decibel (dB) while the voltage level Vi of the testing signal $S_T$ input in the device under test 12 is 10 mV. The decibel (dB) value and the Vi value are substituted in the formula that $$dB = 20 \log \frac{Vo}{Vi},$$

thus calculating the voltage range of the voltage level Vo (the output voltage) as 100 mV~1000 mV. Next, the precision measurement unit 110 measures the actual Vo value. If the voltage range of the voltage level Vo (the output voltage) is between 100 mV~1000 mV, test pass of the device under test 12 is achieved, or test fail thereof is achieved. Alternatively, when the test pass condition of the device under test 12 is predefined and assigned by the voltage level (Vo) of the measurement signal $S_M$, the decibel (dB) value range passing through the decibel (dB) testing the device under test 12 can be defined using the described formula.

Figure 1B:
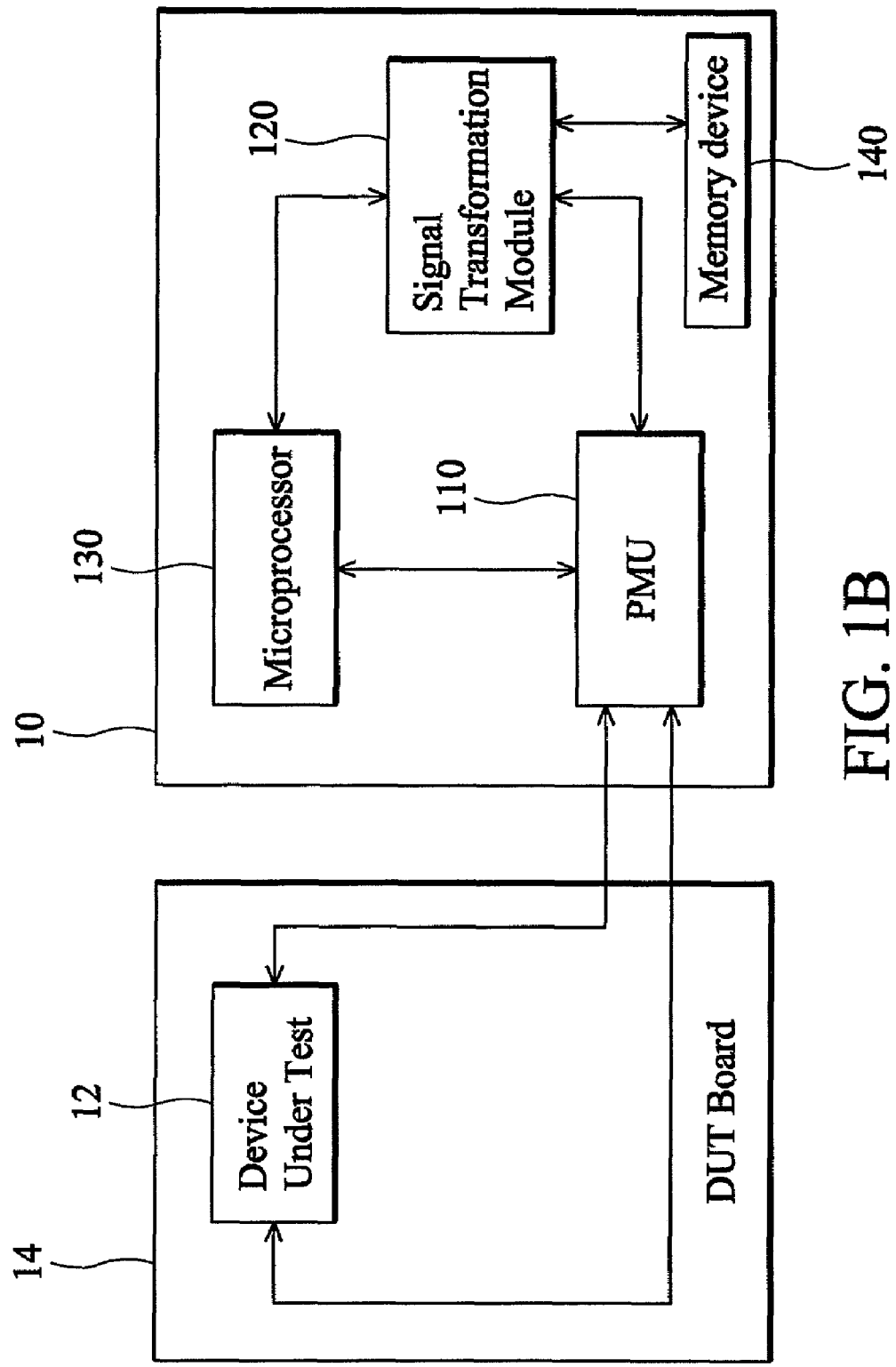

In another embodiment shown in FIG. 1B, the decibel (dB) value, the Vo value, and the Vi value can be pre-stored in a lookup table. The signal transformation module 120 further transforms the measurement signal SM to the signal measurement result $S_R$ according to the lookup table. The circuit testing apparatus 10 further comprises a memory device 140, coupled to the signal transformation module, storing the lookup table. In another embodiment, the memory device 140 is a static random access memory (SRAM). Additionally, the circuit testing apparatus 10 further comprises a display module (not shown), displaying the test result of the device under test 12.

Figure 1C:
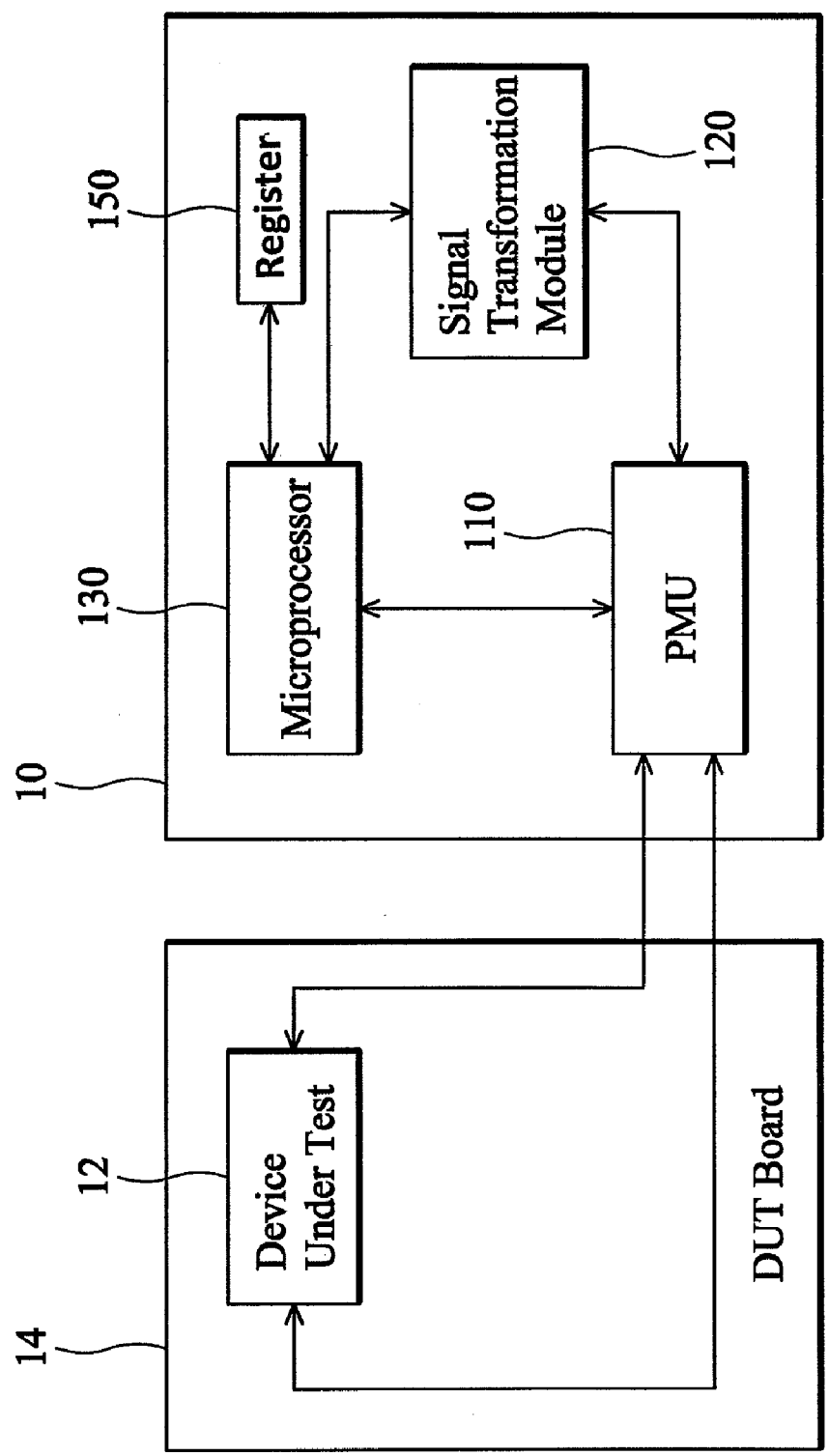

In another embodiment shown in FIG. 1C, the circuit testing apparatus 10 further comprises a register 150, coupled to the microprocessor, storing test results. When the circuit testing apparatus 10 simultaneously tests multiple devices under test 12, test results of each device under test 12 can first be stored in the register 150. When testing of all the devices under test 12 is complete, the test results are retrieved from the register 150 to determine whether test pass or fail of each device under test 12 is achieved, reducing test time and enhancing test efficiency.

Figure 2:
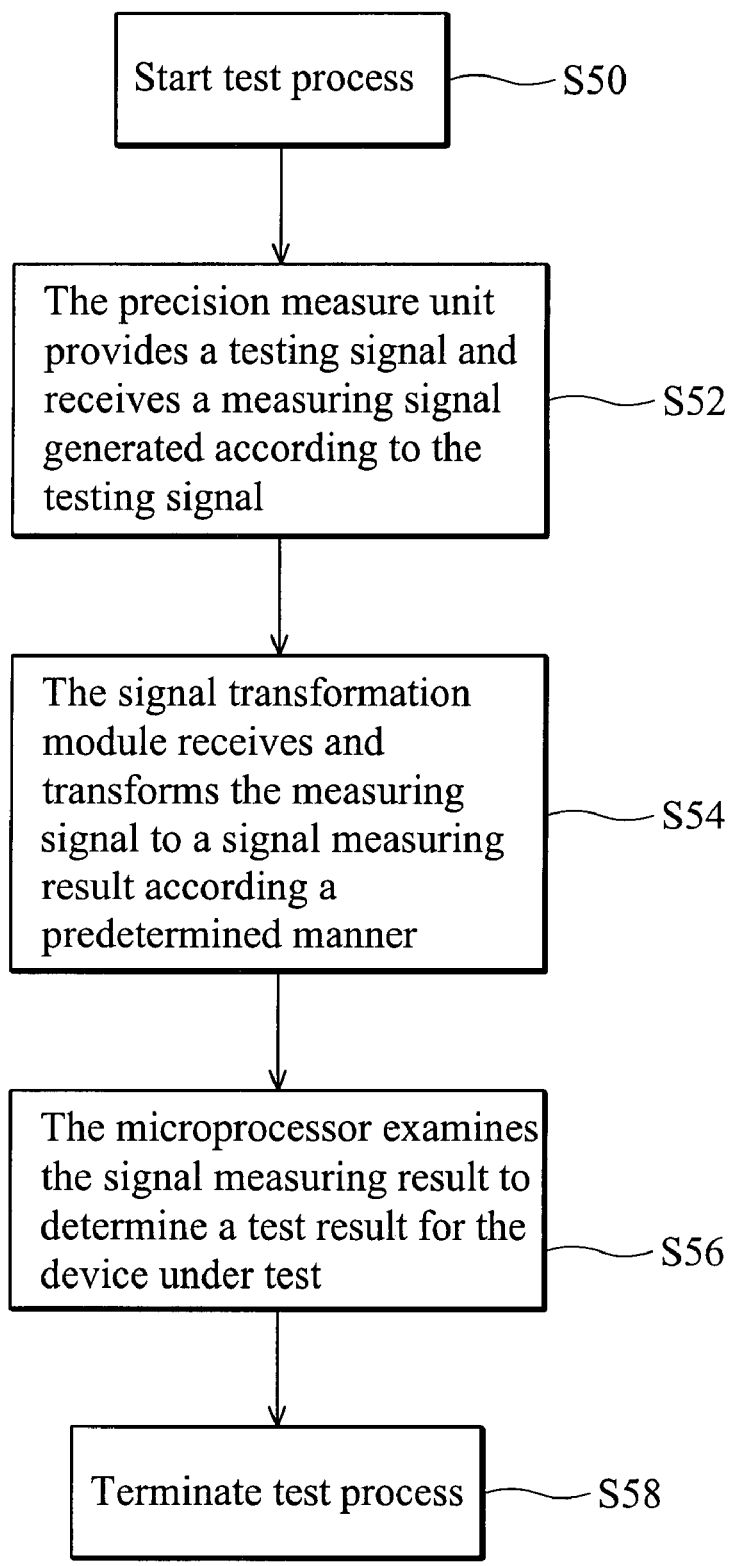
FIG. 2 is a flowchart of an embodiment of a circuit testing apparatus testing devices under test.

FIG. 2 is a flowchart of an embodiment of a circuit testing apparatus testing devices under test. Referring to FIGS. 1 and 2, circuit testing apparatus 10 testing device under test 12 comprising the following.

The test process starts (step S50). The precision measurement unit 110 provides a testing signal $S_T$ and receives a measurement signal $S_M$ generated according to the testing signal $S_T$ (step S52). The signal transformation module 120 receives the measurement signal $S_M$ and transforms the measurement signal $S_M$ to a signal measurement result $S_R$ according a predetermined manner (step S54). The microprocessor 130 examines the signal measurement result to determine a test result for the device under test 12 (step S56). The test process terminates (step S58).

The circuit testing apparatus of the invention transforms measurement signals generated by a device under test to a signal measurement result using a signal transformation module and determines whether test pass of the device under test is achieved according to the signal measurement result. When compared with conventional methods manually transforming measurement signals to signal measurement results, the circuit testing apparatus of the invention increases testing speed and improves testing efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit testing apparatus, testing a device under test, comprising:
   a precision measurement unit, coupled to the device under test, providing a testing signal and receiving a measurement signal generated according to the testing signal;
   a signal transformation module, coupled to the precision measurement unit, receiving and transforming the measurement signal to a signal measurement result using a predetermined manner; and
   a microprocessor, coupled to the precision measurement unit and the signal transformations module, determining a test result of the device under test according to the signal measurement result;
   wherein the predetermined manner transforms the measurement signal providing a voltage level to the signal measurement result providing a decibel (dB) value.

2. The circuit testing apparatus as claimed in claim 1, wherein the predetermined manner transforms the measurement signal to the signal measurement result using a formula, represented as:

$dB=20 \log(Vo/Vi)$, where dB represents a decibel (dB) value of the signal measurement result, Vi represents a voltage level of the testing signal, and Vo represents a voltage level of the measurement signal.

3. The circuit testing apparatus as claimed in claim 1, further comprising a register, coupled to the microprocessor, storing the test result.

4. The circuit testing apparatus as claimed in claim 1, wherein the circuit testing apparatus is a logic tester.

5. The circuit testing apparatus as claimed in claim 1, wherein the device under test is an integrated circuit (IC).

6. The circuit testing apparatus as claimed in claim 1, further comprising a display module, displaying the test result of the device under test.

7. The circuit testing apparatus as claimed in claim 1, wherein the predetermined manner transforms the measurement signal to the signal measurement result according to a lookup table.

8. The circuit testing apparatus as claimed in claim 7, wherein the signal transformation module transforms the measurement signal to the signal measurement result according to the lookup table.

9. The circuit testing apparatus as claimed in claim 7, further comprising a memory device, coupled to the signal transformation module, storing the lookup table.

10. The circuit testing apparatus as claimed in claim 9, wherein the memory device is a SRAM.

* * * * *